(12) United States Patent
Itagaki et al.

(10) Patent No.: US 7,936,591 B2
(45) Date of Patent: May 3, 2011

(54) MAGNETORESISTIVE RANDOM ACCESS MEMORY

(75) Inventors: Kiyotaro Itagaki, Yokohama (JP); Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/356,722

(22) Filed: Jan. 21, 2009

(65) Prior Publication Data
US 2009/0190391 A1 Jul. 30, 2009

(30) Foreign Application Priority Data

Jan. 28, 2008 (JP) .................................. 2008-016173

(51) Int. Cl.
*G11C 11/00* (2006.01)
(52) U.S. Cl. ........ 365/158; 365/121; 365/131; 365/171; 365/173; 365/189.15; 365/230.06; 365/233.17
(58) Field of Classification Search .................. 365/121, 365/158, 131, 171, 173, 189.15, 230.06, 365/233.17
See application file for complete search history.

(56) References Cited

U.S. PATENT DOCUMENTS

| 2007/0279963 A1* | 12/2007 | Tsuchida et al. | 365/148 |
| 2007/0285974 A1* | 12/2007 | Takemura et al. | 365/158 |
| 2009/0067212 A1* | 3/2009 | Shimizu | 365/148 |

FOREIGN PATENT DOCUMENTS

JP 2004-241013 8/2004

* cited by examiner

*Primary Examiner* — Amir Zarabian
*Assistant Examiner* — Fernando N Hidalgo
(74) *Attorney, Agent, or Firm* — Oblon, Spivak, McClelland, Maier & Neustadt, L.L.P.

(57) ABSTRACT

A word line voltage is applied to a plurality of word lines. A read/write voltage is applied to a plurality of bit lines. The read/write voltage is applied to a plurality of source lines. A word line selector selects the word line and applies the word line voltage. A driver applies a predetermined voltage to the bit line and the source line, thereby supplying a current to the memory cell. A read circuit reads a first current having flowed through the memory cell, and determines data stored in the memory cell. When performing the read, the driver supplies a second current to second bit lines among other bit lines, which are adjacent to the first bit line through which the first current has flowed. The second current generates a magnetic field in a direction to suppress a write error in the memory cell from which data is to be read.

10 Claims, 7 Drawing Sheets

MAGNETORESISTIVE RANDOM ACCESS MEMORY

CROSS-REFERENCE TO RELATED APPLICATIONS

This application is based upon and claims the benefit of priority from prior Japanese Patent Application No. 2008-016173, filed Jan. 28, 2008, the entire contents of which are incorporated herein by reference.

BACKGROUND OF THE INVENTION

1. Field of the Invention

The present invention relates to a magnetoresistive random access memory.

2. Description of the Related Art

The magnetoresistive random access memory (MRAM) is a device that stores information by using the magnetoresistive effect. The MRAM has volatility, a high operating speed, a high integration degree, and high reliability, and hence is expected as a nonvolatile random access memory capable of replacing a DRAM, EEPROM, and the like. In particular, a spin-transfer-torque-write MRAM using magnetization reversal caused by spin current transfer has been attracting attention in recent years because the device has high scalability to micropatterning.

In the spin-transfer-torque-write MRAM, write and read operations are equal in that a current is supplied to a memory cell, and the only difference is the magnitude of the memory cell current. When the read current is large, therefore, the possibility of occurrence of a write error (read disturbance) in a memory cell increases.

To avoid this read disturbance, the read current need only be decreased, and many read methods that achieve this effect have been conventionally proposed. However, decreasing the read current is equivalent to decreasing the resistance against variations in a circuit and decreasing the read speed. This makes it difficult for the spin-transfer-torque-write MRAM to replace a DRAM required to have a large capacity and high speed. Accordingly, demands have arisen for increasing the read current by using a read method capable of avoiding the read disturbance.

For example, Jpn. Pat. Appln. KOKAI Publication No. 2004-241013 has proposed a method of supplying a current for canceling out a magnetic field generated by a current supplied when writing data to a selected memory cell, in order to prevent the magnetic field from exerting influence on an unselected adjacent memory cell. However, this method has no special improvement on a read operation.

In the prior art as explained above, the read current must be decreased because read disturbance may occur if the read current increases. This makes it impossible to provide a high-speed MRAM.

BRIEF SUMMARY OF THE INVENTION

According to an aspect of the present invention, there is provided a magnetoresistive random access memory comprising: a memory cell array in which a plurality of memory cells which hold data are arranged in a first direction and a second direction; a plurality of word lines which are arranged to run in the first direction, and to which a word line voltage for selecting the memory cell is applied; a plurality of bit lines which are arranged to run in the second direction, and to which a read/write voltage for reading data from or writing data to the memory cell is applied; a plurality of source lines which are arranged to run in the second direction, and to which the read/write voltage for reading data from or writing data to the memory cell is applied; a word line selector which selects the word line and applies the word line voltage; a driver which applies a predetermined voltage to the bit line and the source line, thereby supplying a current to the memory cell; and a read circuit which reads a first current having flowed through the memory cell, and determines data stored in the memory cell, wherein when performing the read operation, the driver supplies a second current to second bit lines among other bit lines, which are close to the first bit line through which the first current has flowed, and the second current generates a magnetic field in a direction to suppress a write error in the memory cell from which data is to be read.

DETAILED DESCRIPTION OF THE INVENTION

First Embodiment

Figure 1:
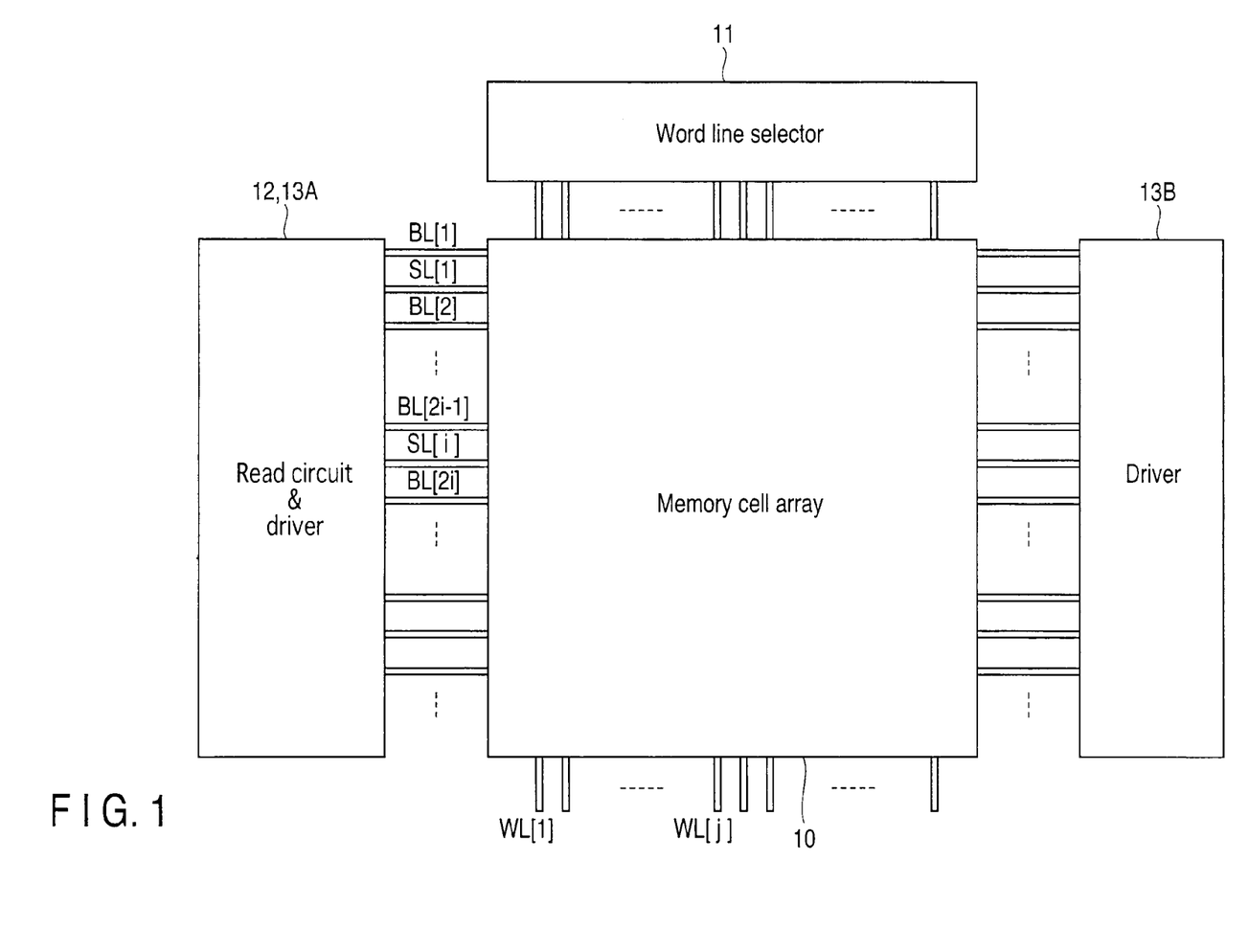
FIG. 1 is a view showing the arrangement of a spin-transfer-torque-write magnetoresistive random access memory of the first embodiment of the present invention.

Embodiments of the present invention will be explained below with reference to the accompanying drawing. FIG. 1 shows the main parts of a spin-transfer-torque-write magnetoresistive random access memory (MRAM) according to the first embodiment of the present invention.

A memory cell array 10 is formed by arranging electrically programmable nonvolatile memory cells in a matrix. A plurality of word lines WL running in the first direction are connected to a word line selector 11. A plurality of bit lines BL running in the second direction are connected to a read circuit 12 and drivers 13A and 13B. A plurality of source lines SL are also connected to the drivers 13A and 13B. The read circuit 12 is placed at one end of each of the plurality of bit lines BL running in the second direction. The drivers 13A and 13B are arranged at the two ends of each of the plurality of bit lines BL and the plurality of source lines SL running in the second direction.

Figure 3:
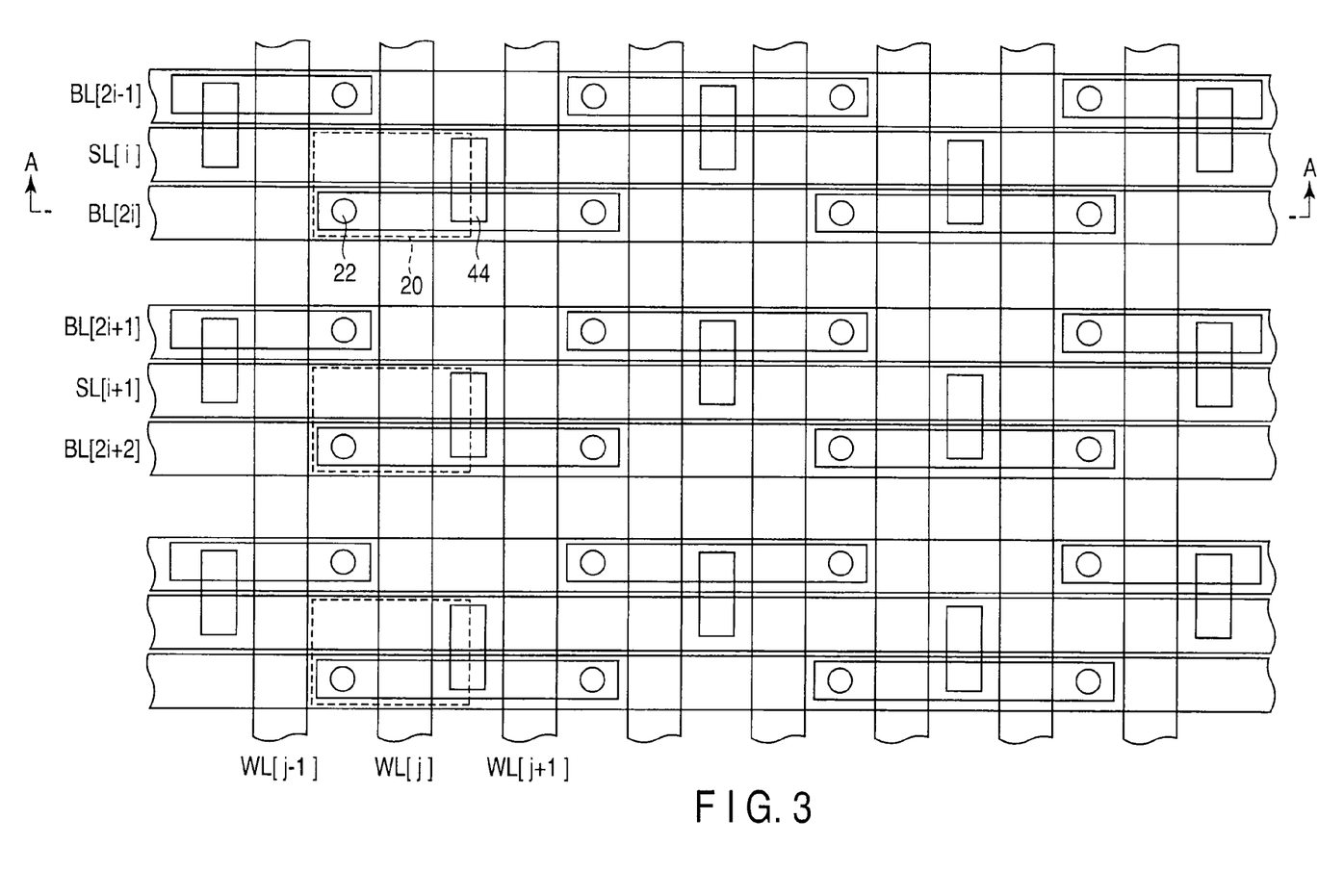
FIG. 3 is a plane view of the internal memory cell array of the spin-transfer-torque-write magnetoresistive random access memory.
Figure 4:
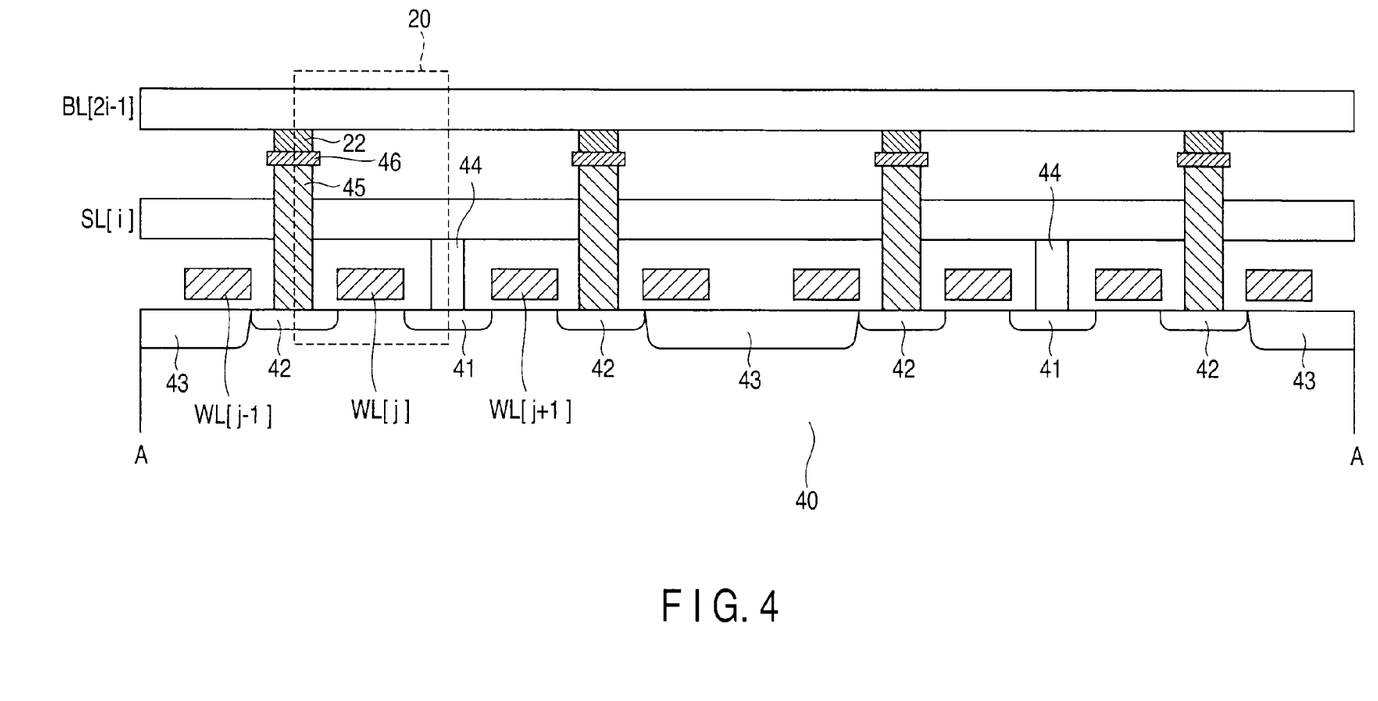
FIG. 4 is a sectional view of a portion taken along line A-A in FIG. 3 according to the first and second embodiments.
Figure 5:
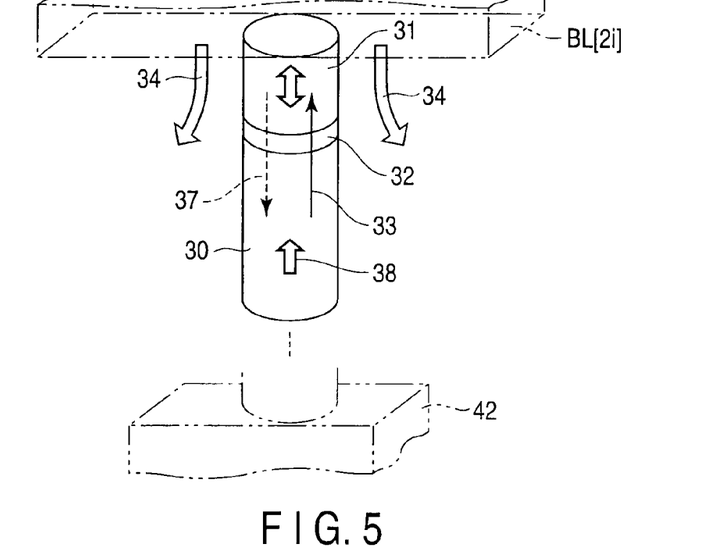
FIG. 5 is a view showing the forces applied to a tunnel magnetoresistive element when suppressing read disturbance according to the spin-transfer-torque-write magnetoresistive random access memory of the first embodiment.

FIGS. 2 to 5 illustrate the internal configurations of the memory cell array 10 of the spin-transfer-torque-write MRAM according to the first embodiment of the present invention. As shown in an equivalent circuit diagram of FIG. 2, a memory cell 20 is formed by connecting a MOS transistor 21 and tunnel magnetoresistive element 22 in series. The tunnel magnetoresistive element 22 is placed between a second main electrode 23 of the MOS transistor 21 and a bit line BL[2i]. The second main electrode 23 is, e.g., a drain electrode. In the tunnel magnetoresistive element 22 as shown in FIG. 5, a nonmagnetic material (referred to as an insulating layer hereinafter) 32 made of an insulator is sandwiched between a magnetic material (referred to as a fixed layer or reference layer hereinafter) 30 in which the spin direction (referred to as the magnetization direction hereinafter) of electrons is fixed, and a magnetic material (referred to as a free layer or recording layer hereinafter) 31 in which the magnetization direction is variable.

The insulating layer 32 is made of an element such as magnesium oxide (MgO). The magnetic materials 30 and 31 are made of, e.g., a transition metal magnetic element such as iron (Fe) or nickel (Ni), or an alloy, such as NiFe, of the transition metal magnetic elements. The magnetic materials 30 and 31 have magnetization directions. When the magnetization directions in the upper and lower magnetic materials 30 and 31 are equal, the resistance of the whole tunnel magnetoresistive element 22 decreases. When the magnetization directions in the upper and lower magnetic materials are opposite, the resistance of the whole tunnel magnetoresistive element 22 increases. This phenomenon is called the tunnel magnetoresistive effect. The MRAM uses this difference between the resistances as data "0" and "1".

In the first embodiment, the free layer 31 of the tunnel magnetoresistive element 22 is connected to the common bit line BL[2i], and the fixed layer 30 of the tunnel magnetoresistive element 22 is connected to the drain electrode 23 of the MOS transistor 21. A magnetization direction 38 in the fixed layer 30 is fixed in the direction from a drain diffusion layer 42 to the bit line BL. The memory cells 20 arranged along the first direction are connected to a common word line WL[j], and first main electrodes 25 of the MOS transistors 21 of the memory cells arranged in the second direction are connected to a common source line SL[i]. The first main electrode 25 is, e.g., a source electrode.

Figure 2:
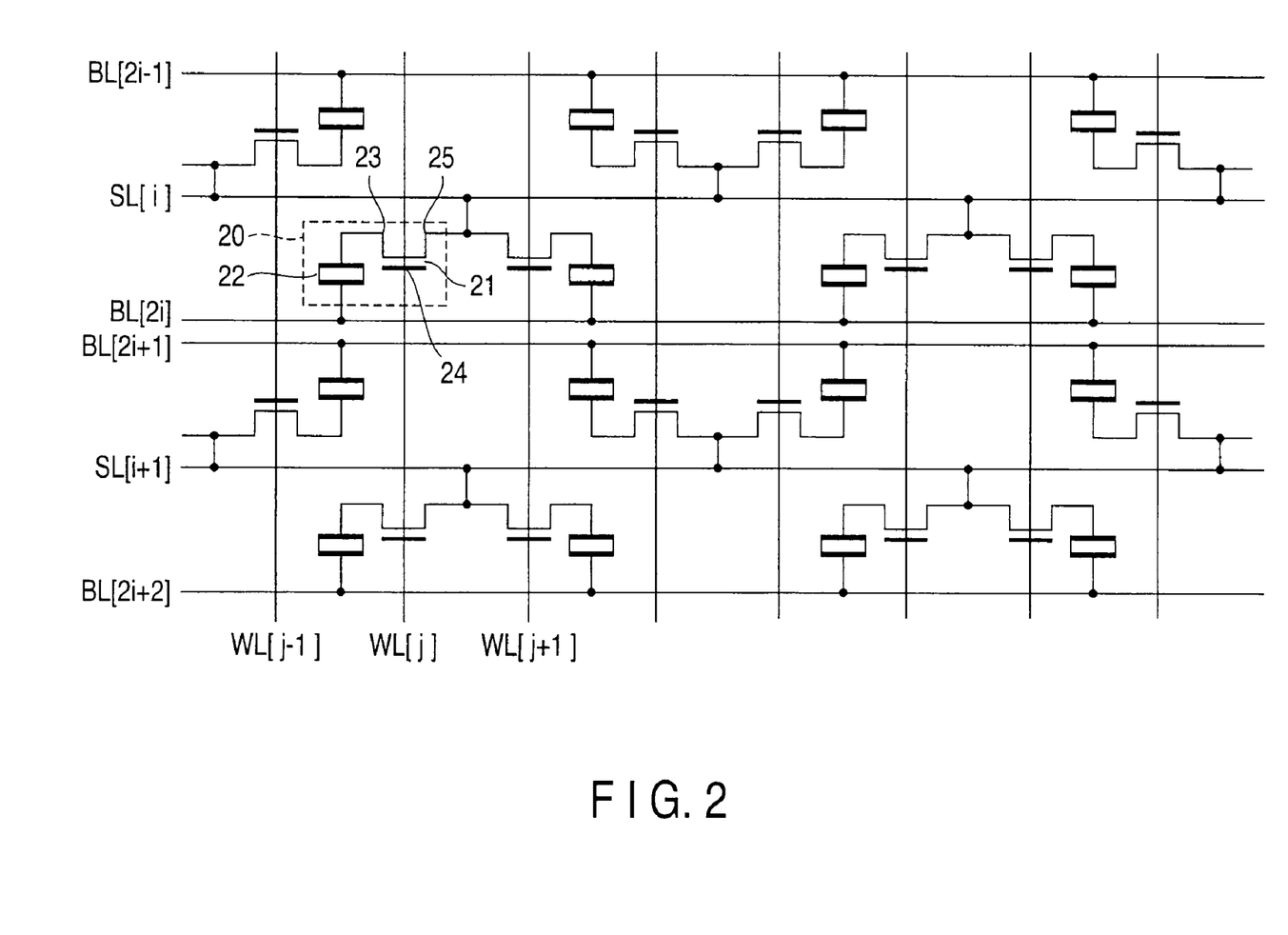
FIG. 2 is an equivalent circuit diagram of an internal memory cell array of the spin-transfer-torque-write magnetoresistive random access memory.

FIG. 3 is a plan view showing the layout of the equivalent circuit of the memory cell array 10 shown in FIG. 2. FIG. 4 shows a portion of a sectional view taken along line A-A in FIG. 3. As shown in FIG. 3, the memory cells 20 are formed at the intersections of the word lines WL and bit lines BL. Each source line SL is placed between two bit lines BL. Each memory cell 20 has an N-type source diffusion layer 41 and the N-type drain diffusion layer 42 formed in a P-type well layer 40 of a silicon substrate. A contact plug 44 connects the N-type source diffusion layer 41 to the source line SL[i]. An insulating layer 43 is formed in a region of the P-type well 40 where the diffusion layers 41 and 42 are not formed. Also, the tunnel magnetoresistive element 22, a metal interconnection layer 46, and a contact plug 45 are formed between the N-type drain diffusion layer 42 and bit line BL[2i] in the order named from the side of the bit line BL[2i].

A read method of the spin-transfer-torque-write MRAM according to the first embodiment of the present invention will be explained below with reference to FIG. 6. The case where data stored in the memory cell 20 at the intersection of the bit line BL[2i] and word line WL[j] is read will be explained as an example.

The MOS transistor 21 is activated by applying a word line voltage to the word line WL[j]. The read circuit 12 precharges a read voltage to the bit line BL[2i]. At the same time, the drivers 13A and 13B ground the source line SL[i] connected to the source electrode 25 of the MOS transistor 21. Consequently, a first current 37 (see FIG. 5) flows through the memory cell 20. Since the resistance of the tunnel magnetoresistive element 22 changes in accordance with the spin directions of electrons in the fixed layer 30 and free layer 31, the read voltage precharged to the bit line BL[2i] changes in accordance with the resistance of the tunnel magnetoresistive element 22. On the basis of the change in read voltage precharged to the bit line BL[2i], the read circuit 12 checks whether the data stored in the memory cell 20 is "1" or "0".

As described above, the first current 37 flows through the tunnel magnetoresistive element 22 when performing a read operation. As shown in FIG. 5, the first current 37 flowing from the free layer 31 to the fixed layer 30 generates spin transfer torque (STT) 33 having an originally unnecessary write effect in the direction from the fixed layer 30 to the free layer 31.

To suppress the generation of the STT 33, therefore, a magnetic field HBL 34 is generated in the tunnel magnetoresistive element 22 in a direction to suppress the STT 33 (the opposite direction to the STT 33), i.e., in the direction from the free layer 31 to the fixed layer 30. As shown in FIG. 6, the magnetic field HBL 34 can be generated by supplying, to an adjacent bit line BL[2i−1], a second current 35 that flows from the driver 13A to the driver 13B, and supplying, to an adjacent bit line BL[2i+1], a second current 36 that flows from the driver 13B to the driver 13A. The second currents 35 and 36 generate the magnetic field HBL 34 by the right-handed screw rule. Note that even the second current 35 or 36 alone generates the magnetic field HBL 34, but the use of the two currents can increase the intensity of the magnetic field HBL 34.

As described above, the read method of this embodiment can implement a spin-transfer-torque-write MRAM capable of reducing read disturbance occurring in a read operation.

Second Embodiment

Figure 7:
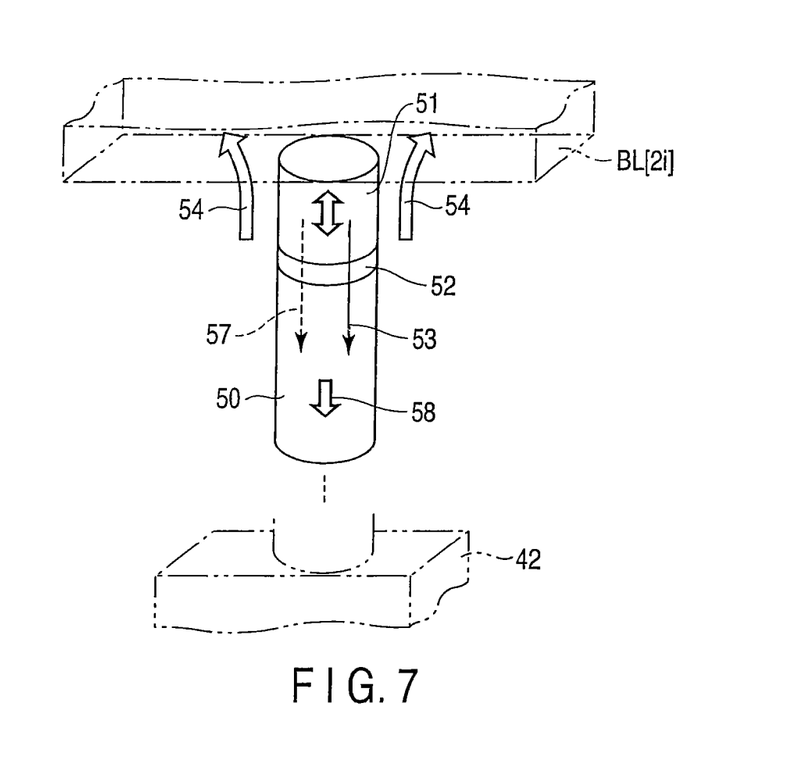
FIG. 7 is a view showing the forces applied to a tunnel magnetoresistive element when suppressing read disturbance according to the spin-transfer-torque-write magnetoresistive random access memory of the second embodiment.
Figure 8:
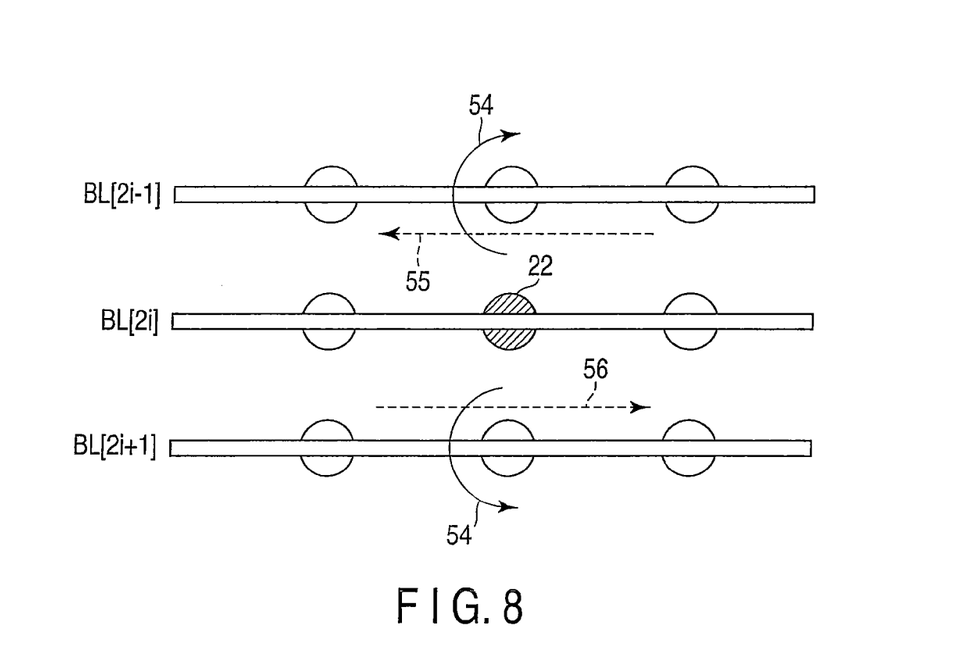
FIG. 8 is an exemplary view showing a read disturbance suppression method according to the spin-transfer-torque-write magnetoresistive random access memories of the second and fourth embodiments.

FIGS. 7 and 8 illustrate the arrangement and read method of a tunnel magnetoresistive element 22 of a spin-transfer-torque-write MRAM according to the second embodiment of the present invention. The arrangements of the main components of the second embodiment are the same as those of the first embodiment shown in FIGS. 1 to 4.

As shown in FIG. 7, the difference from the first embodiment is that a magnetization direction 58 in a fixed layer 50 of the tunnel magnetoresistive element 22 is fixed not in the direction from a drain diffusion layer 42 to a bit line BL[2i], but in the opposite direction, i.e., the direction from the bit line BL[2i] to the drain diffusion layer 42. Accordingly, the direction of SST 53 is also opposite to that in the first embodiment, i.e., the SST 53 is generated in the direction from a free layer 51 to the fixed layer 50. Therefore, a magnetic field HBL 54 is generated in the tunnel magnetoresistive element 22 in a direction to suppress the STT 53, i.e., in the direction from the fixed layer 50 to the free layer 51.

As shown in FIG. 8, the magnetic field HBL 54 can be generated by supplying, to an adjacent bit line BL[2*i*−1], a second current 55 that flows from a driver 13B to a driver 13A, and supplying, to an adjacent bit line BL[2*i*+1], a second current 56 that flows from the driver 13A to the driver 13B. The second currents 55 and 56 generate the magnetic field HBL 54 by the right-handed screw rule. Note that even the second current 55 or 56 alone generates the magnetic field HBL 54, but the use of the two currents can increase the intensity of the magnetic field HBL 54.

As described above, the read method of this embodiment can implement a spin-transfer-torque-write MRAM capable of reducing read disturbance occurring in a read operation.

Third Embodiment

Figure 6:
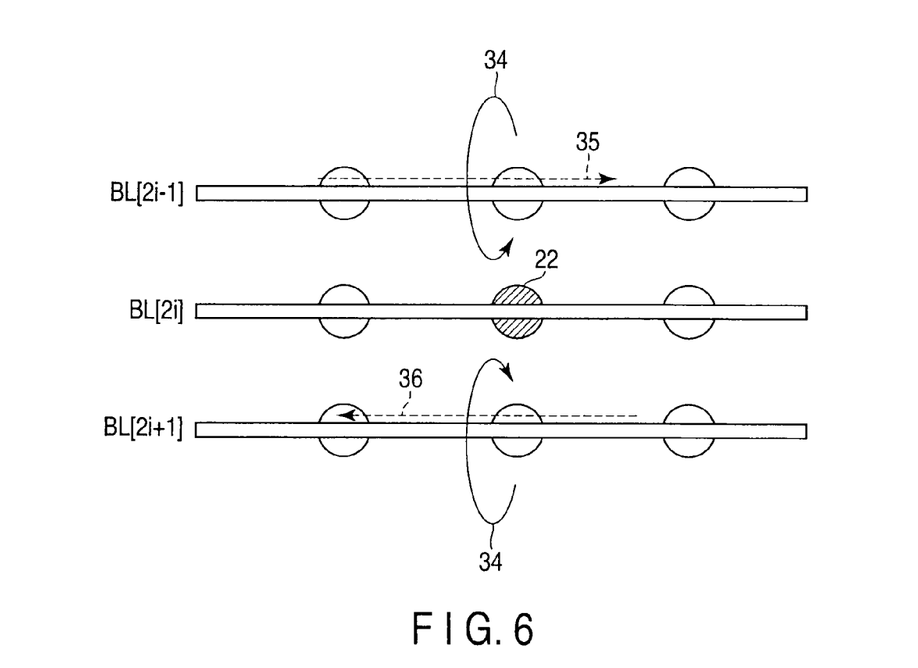
FIG. 6 is an exemplary view showing a read disturbance suppression method according to the spin-transfer-torque-write magnetoresistive random access memories of the first and third embodiments.
Figure 9:
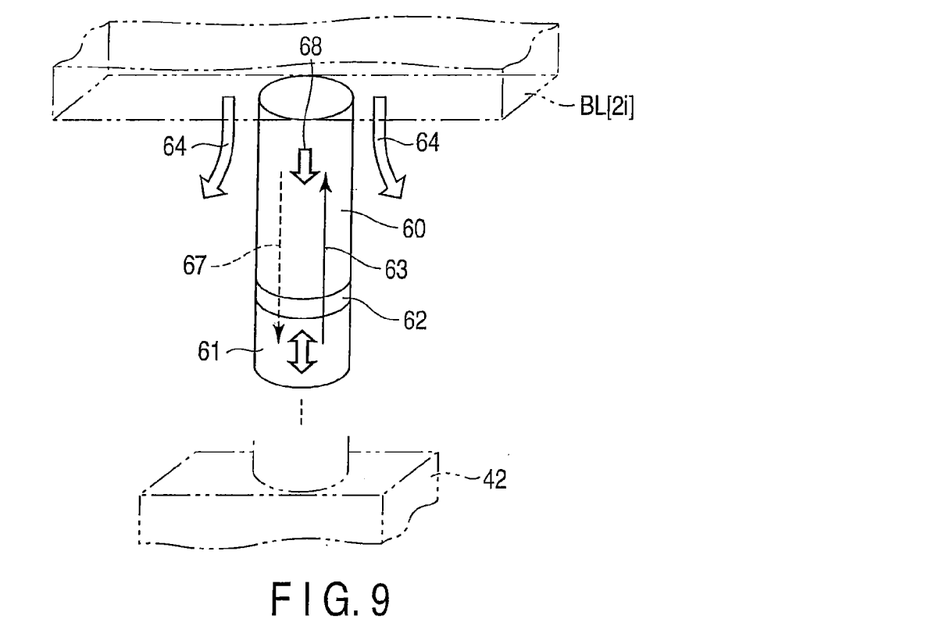
FIG. 9 is a view showing the forces applied to a tunnel magnetoresistive element when suppressing read disturbance according to the spin-transfer-torque-write magnetoresistive random access memory of the third embodiment.

FIGS. 6 and 9 illustrate the arrangement and read method of a tunnel magnetoresistive element 22 of a spin-transfer-torque-write MRAM according to the third embodiment of the present invention. The arrangements of the major parts of the third embodiment are the same as those of the first embodiment shown in FIGS. 1 to 3.

As shown in FIG. 9, the difference from the first embodiment is that in the tunnel magnetoresistive element 22, a fixed layer 60, insulating layer 62, and free layer 61 are arranged between a drain diffusion layer 42 and bit line BL[2*i*] in the order named from the side of the bit line BL[2*i*]. This arrangement order is opposite to that of the first embodiment. In addition, a magnetization direction 68 in the fixed layer 60 is fixed in the direction from the bit line BL[2*i*] to the drain diffusion layer 42. During a read operation, STT 63 is generated in the same direction as that of the first embodiment, i.e., in the direction from the free layer 61 to the fixed layer 60. Therefore, the operation of suppressing the STT 63 can be the same as that of the first embodiment shown in FIG. 6.

As described above, the read method of this embodiment can implement a spin-transfer-torque-write MRAM capable of reducing read disturbance occurring in a read operation.

Fourth Embodiment

Figure 10:
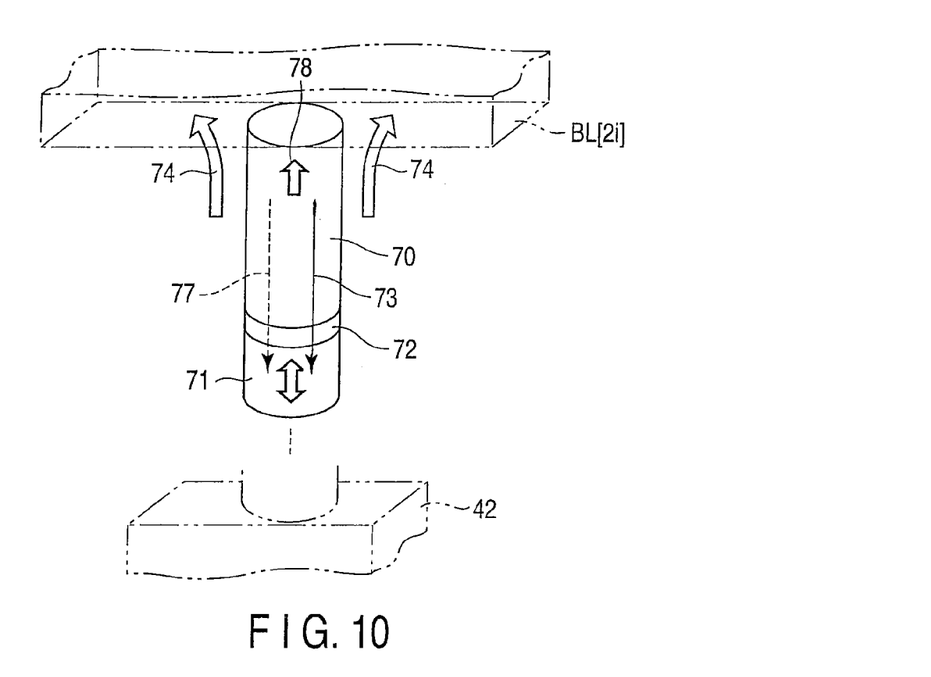
FIG. 10 is a view showing the forces applied to a tunnel magnetoresistive element when suppressing read disturbance according to the spin-transfer-torque-write magnetoresistive random access memory of the fourth embodiment.

FIGS. 8 and 10 illustrate the arrangement and read method of a tunnel magnetoresistive element 22 of a spin-transfer-torque-write MRAM according to the fourth embodiment of the present invention. The arrangements of the major components of the fourth embodiment are the same as those of the first embodiment shown in FIGS. 1 to 3.

As shown in FIG. 10, the difference from the first embodiment is that in the tunnel magnetoresistive element 22, a fixed layer 70, insulating layer 72, and free layer 71 are arranged between a drain diffusion layer 42 and bit line BL[2*i*] in the order named from the side of the bit line BL[2*i*]. This arrangement order is opposite to that of the first embodiment. In addition, a magnetization direction 78 in the fixed layer 70 is fixed in the direction from the drain diffusion layer 42 to the bit line BL[2*i*]. During a read operation, STT 73 is generated in the opposite direction to that of the first embodiment, i.e., in the direction from the fixed layer 70 to the free layer 71. Therefore, a magnetic field HBL 74 is generated in a direction to suppress the STT 73, i.e., in the direction from the free layer 71 to the fixed layer 70.

As shown in FIG. 8, the magnetic field HBL 74 can be generated by supplying, to an adjacent bit line BL[2*i*−1], a second current 55 that flows from a driver 13B to a driver 13A, and supplying, to an adjacent bit line BL[2*i*+1], a second current 56 that flows from the driver 13A to the driver 13B. The second currents 55 and 56 generate the magnetic field HBL 74 by the right-handed screw rule. Note that even the second current 55 or 56 alone generates the magnetic field HBL 74, but the use of the two currents can increase the intensity of the magnetic field HBL 74.

As described above, the read method of this embodiment can implement a spin-transfer-torque-write MRAM capable of reducing read disturbance occurring in a read operation.

Each embodiment of the present invention can provide a magnetoresistive random access memory capable of preventing read disturbance.

Also, the embodiments described above can be practiced not only singly but also in the form of an appropriate combination. Furthermore, the above-mentioned embodiments include inventions in various stages. Therefore, the inventions in the various stages can also be extracted by properly combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive random access memory, comprising:
a memory cell array in which a plurality of memory cells which hold data are arranged in a first direction and a second direction;
a plurality of word lines which are arranged to run in the first direction and to which a word line voltage for selecting a memory cell is applied;
a plurality of bit lines which are arranged to run in the second direction and to which a read/write voltage for reading the data from or writing the data to the memory cell is applied;
a plurality of source lines which are arranged to run in the second direction and to which the read/write voltage for reading the data from or writing the data to the memory cell is applied;
a word line selector which selects a word line and applies the word line voltage;
a driver which applies a predetermined voltage to a bit line and a source line, thereby supplying a current to the memory cell; and
a read circuit which reads a first current having flowed through the memory cell and determines the data stored in the memory cell, wherein,
when performing a read operation, the driver supplies a second current to second bit lines among other bit lines, which are close to a first bit line through which the first current has flowed, and the second current generates a magnetic field in a direction to suppress a write error in the memory cell from which the data is to be read,
the memory cell is formed by connecting a MOSFET and a tunnel magnetoresistive element in series,
the MOSFET has a gate electrode connected to the word line, and a first main electrode connected to the source line,
the tunnel magnetoresistive element includes a first magnetic layer connected to the bit line, and a second magnetic layer connected to a second main electrode of the MOSFET, when performing the read operation, the driver supplies the second current to one of the second bit lines adjacent to the first bit line, and the second current generates a magnetic field in a direction to suppress a spin transfer torque generated inside the tunnel magnetoresistive element by the first current, and, when the second magnetic layer is a reference layer having a magnetization directed to the first magnetic layer, the spin transfer torque occurs in a direction from the second magnetic layer to the first magnetic layer, and the second current generates a magnetic field in a direction from the first magnetic layer to the second magnetic layer.

2. A magnetoresistive random access memory, comprising:

a memory cell array in which a plurality of memory cells which hold data are arranged in a first direction and a second direction;

a plurality of word lines which are arranged to run in the first direction and to which a word line voltage for selecting a memory cell is applied;

a plurality of bit lines which are arranged to run in the second direction and to which a read/write voltage for reading the data from or writing the data to the memory cell is applied;

a plurality of source lines which are arranged to run in the second direction and to which the read/write voltage for reading the data from or writing the data to the memory cell is applied;

a word line selector which selects a word line and applies the word line voltage;

a driver which applies a predetermined voltage to a bit line and a source line, thereby supplying a current to the memory cell; and a read circuit which reads a first current having flowed through the memory cell and determines the data stored in the memory cell, wherein, when performing a read operation, the driver supplies a second current to second bit lines among other bit lines, which are close to a first bit line through which the first current has flowed, and the second current generates a magnetic field in a direction to suppress a write error in the memory cell from which the data is to be read, the memory cell is formed by connecting a MOSFET and a tunnel magnetoresistive element in series, the MOSFET has a gate electrode connected to the word line, and a first main electrode connected to the source line, the tunnel magnetoresistive element includes a first magnetic layer connected to the bit line, and a second magnetic layer connected to a second main electrode of the MOSFET, when performing the read operation, the driver supplies the second current to one of the second bit lines adjacent to the first bit line, and the second current generates a magnetic field in a direction to suppress a spin transfer torque generated inside the tunnel magnetoresistive element by the first current, and, when the second magnetic layer is a reference layer having a magnetization directed to the second main electrode, the spin transfer torque occurs in a direction from the first magnetic layer to the second magnetic layer, and the second current generates a magnetic field in a direction from the second magnetic layer to the first magnetic layer.

3. A magnetoresistive random access memory, comprising:

a memory cell array in which a plurality of memory cells which hold data are arranged in a first direction and a second direction;

a plurality of word lines which are arranged to run in the first direction and to which a word line voltage for selecting a memory cell is applied;

a plurality of bit lines which are arranged to run in the second direction and to which a read/write voltage for reading the data from or writing the data to the memory cell is applied;

a plurality of source lines which are arranged to run in the second direction and to which the read/write voltage for reading the data from or writing the data to the memory cell is applied;

a word line selector which selects a word line and applies the word line voltage;

a driver which applies a predetermined voltage to a bit line and a source line, thereby supplying a current to the memory cell; and a read circuit which reads a first current having flowed through the memory cell and determines the data stored in the memory cell, wherein, when performing a read operation, the driver supplies a second current to second bit lines among other bit lines, which are close to a first bit line through which the first current has flowed, and the second current generates a magnetic field in a direction to suppress a write error in the memory cell from which the data is to be read, the memory cell is formed by connecting a MOSFET and a tunnel magnetoresistive element in series, the MOSFET has a gate electrode connected to the word line, and a first main electrode connected to the source line, the tunnel magnetoresistive element includes a first magnetic layer connected to the bit line, and a second magnetic layer connected to a second main electrode of the MOSFET, when performing the read operation, the driver supplies the second current to one of the second bit lines adjacent to the first bit line, and the second current generates a magnetic field in a direction to suppress a spin transfer torque generated inside the tunnel magnetoresistive element by the first current, and, when the first magnetic layer is a reference layer having a magnetization directed to the second magnetic layer, the spin transfer torque occurs in a direction from the second magnetic layer to the first magnetic layer, and the second current generates a magnetic field in a direction from the first magnetic layer to the second magnetic layer.

4. A magnetoresistive random access memory, comprising:

a memory cell array in which a plurality of memory cells which hold data are arranged in a first direction and a second direction;

a plurality of word lines which are arranged to run in the first direction and to which a word line voltage for selecting a memory cell is applied;

a plurality of bit lines which are arranged to run in the second direction and to which a read/write voltage for reading the data from or writing the data to the memory cell is applied;

a plurality of source lines which are arranged to run in the second direction and to which the read/write voltage for reading the data from or writing the data to the memory cell is applied;

a word line selector which selects a word line and applies the word line voltage;

a driver which applies a predetermined voltage to a bit line and a source line, thereby supplying a current to the memory cell; and a read circuit which reads a first current having flowed through the memory cell and determines the data stored in the memory cell, wherein, when performing a read operation, the driver supplies a second current to second bit lines among other bit lines, which are close to a first bit line through which the first current has flowed, and the second current generates a magnetic field in a direction to suppress a write error in the memory cell from which the data is to be read, the memory cell is formed by connecting a MOSFET and a tunnel magnetoresistive element in series, the MOSFET has a gate electrode connected to the word line, and a first main electrode connected to the source line, the tunnel magnetoresistive element includes a first magnetic layer connected to the bit line, and a second magnetic layer connected to a second main electrode of the MOSFET, when performing the read operation, the driver supplies the second current to one of the second bit lines adjacent to the first bit line, and the second current generates a magnetic field in a direction to suppress a spin transfer torque generated inside the tunnel magnetoresistive element by the first current, and when the first magnetic layer is a reference layer having a magnetization directed to the bit line, the spin transfer torque occurs in a direction from the first magnetic layer to the second magnetic layer, and the second current generates a magnetic field in a direction from the second magnetic layer to the first magnetic layer.

5. A magnetoresistive random access memory, comprising:

a memory cell array in which a plurality of memory cells which hold data are arranged in a first direction and a second direction;

a plurality of word lines which are arranged to run in the first direction and to which a word line voltage for selecting the memory cell is applied;

a plurality of bit lines which are arranged to run in the second direction and to which a read/write voltage for reading the data from or writing the data to the memory cell is applied;

a plurality of source lines which are arranged to run in the second direction and to which the read/write voltage for reading the data from or writing the data to the memory cell is applied;

a word line selector which selects a word line and applies the word line voltage;

a driver which applies a predetermined voltage to a bit line and a source line, thereby supplying a current to the memory cell; and a read circuit which reads a first current having flowed through the memory cell and determines the data stored in the memory cell, wherein, when performing a read operation, the driver supplies a second current to second bit lines among other bit lines, which are close to a first bit line through which the first current has flowed, and the second current generates a magnetic field in a direction to suppress a write error in the memory cell from which the data is to be read, the memory cell is formed by connecting a MOSFET and a tunnel magnetoresistive element in series, the MOSFET has a gate electrode connected to the word line, and a first main electrode connected to the source line, the tunnel magnetoresistive element includes a first magnetic layer connected to the bit line, and a second magnetic layer connected to a second main electrode of the MOSFET, and, when performing the read operation, the driver supplies the second current to the second bit lines adjacent to the first bit line on two sides thereof, and the second current generates a magnetic field in a direction to suppress a spin transfer torque generated inside the tunnel magnetoresistive element by the first current.

6. The memory according to claim 5, wherein, when the second magnetic layer is a reference layer having a magnetization directed to the first magnetic layer, the spin transfer torque occurs in a direction from the second magnetic layer to the first magnetic layer, and the second current generates a magnetic field in a direction from the first magnetic layer to the second magnetic layer.

7. The memory according to claim 5, wherein, when the second magnetic layer is a reference layer having a magnetization directed to the second main electrode, the spin transfer torque occurs in a direction from the first magnetic layer to the second magnetic layer, and the second current generates a magnetic field in a direction from the second magnetic layer to the first magnetic layer.

8. The memory according to claim 5, wherein, when the first magnetic layer is a reference layer having a magnetization directed to the second magnetic layer, the spin transfer torque occurs in a direction from the second magnetic layer to the first magnetic layer, and the second current generates a magnetic field in a direction from the first magnetic layer to the second magnetic layer.

9. The memory according to claim 5, wherein, when the first magnetic layer is a reference layer having a magnetization directed to the bit line, the spin transfer torque occurs in a direction from the first magnetic layer to the second magnetic layer, and the second current generates a magnetic field in a direction from the second magnetic layer to the first magnetic layer.

10. The memory according to claim 5, wherein the driver includes drivers arranged at two ends of a second bit line running in the first direction to supply the second current to the second bit line.

* * * * *